(12) United States Patent
Yang et al.

(10) Patent No.: US 6,418,060 B1
(45) Date of Patent: Jul. 9, 2002

(54) METHOD OF PROGRAMMING AND ERASING NON-VOLATILE MEMORY CELLS

(75) Inventors: Ching-Sung Yang, Chang-Hua Hsien; Ching-Hsiang Hsu, Hsin-Chu, both of (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 09/683,463

(22) Filed: Jan. 3, 2002

(51) Int. Cl.[7] ............................................... G11C 16/00
(52) U.S. Cl. ............................ 365/185.28; 365/185.18
(58) Field of Search ..................... 365/185.28, 185.29, 365/185.26, 185.18

(56) References Cited

U.S. PATENT DOCUMENTS

| | | | | |
|---|---|---|---|---|
| 4,698,787 A | * | 10/1987 | Mukherjee et al. .... | 365/185.28 |
| 5,349,220 A | * | 9/1994 | Hong .................... | 365/185.18 |
| 5,491,657 A | * | 2/1996 | Haddad et al. ........ | 365/185.18 |
| 5,535,158 A | * | 7/1996 | Yamasata ............... | 365/185.28 |
| 5,661,687 A | * | 8/1997 | Randazzo .............. | 365/185.28 |
| 6,026,026 A | * | 2/2000 | Chan et al. ............ | 365/185.29 |
| 6,091,635 A | * | 7/2000 | Chi ....................... | 365/185.18 |
| 6,366,499 B1 | * | 4/2002 | Wang .................... | 365/185.28 |

* cited by examiner

Primary Examiner—Tan T. Nguyen
(74) Attorney, Agent, or Firm—Winston Hsu (57) ABSTRACT

A method of selectively programming an individual memory cell of a non-volatile memory array. The non-volatile memory array is an array of memory cells. Each memory cell is made up of an ONO gate built on a substrate, which also acts as a well. On one side of the gate is a diffusion drain encompassed by a localized well region set in the well. On the other side of the gate is a diffusion source set in the well. When operated, appropriate voltages are applied to the source, the gate, the drain, and the localized well region to program or erase the non-volatile memory. The designed localized well region prevents an induction current in the unselected gates of the array, allowing for better selectivity and performance.

20 Claims, 8 Drawing Sheets

METHOD OF PROGRAMMING AND ERASING NON-VOLATILE MEMORY CELLS

BACKGROUND OF INVENTION

1. Field of the Invention

The present invention relates to a method of programming and erasing non-volatile memory cells, and more particularly, to a method of selectively programming an individual memory cell of a non-volatile memory array.

2. Description of the Prior Art

The market for non-volatile memory has been continuously growing in the past few years, and further growth in the near future is foreseen, especially for flash memories due to their enhanced flexibility compared to electrically programmable read-only memories (EPROMs). There are two major applications for flash memories. One application is the use of non-volatile memory integrated with logic systems to allow software updates, store identification codes, reconfigure systems in the field, or simply to be used in smart cards. The other application is to create storage elements, such as memory boards or solid-state hard disks, made of flash memory arrays that are configured to create storage devices to compete with miniature hard disks.

Typically, a flash memory is programmed by channel hot electrons and erased by Fowler-Nordheim (FN) tunneling. One of the drawbacks of operating flash memory cells by means of the channel hot electron (CHE) is high energy dissipation during programming the flash memory cells. Low operating-voltage ONO type flash memory has been developed to reduce energy dissipation during operation. However, this kind of memory still suffers from high energy dissipation during programming.

Figure 1:
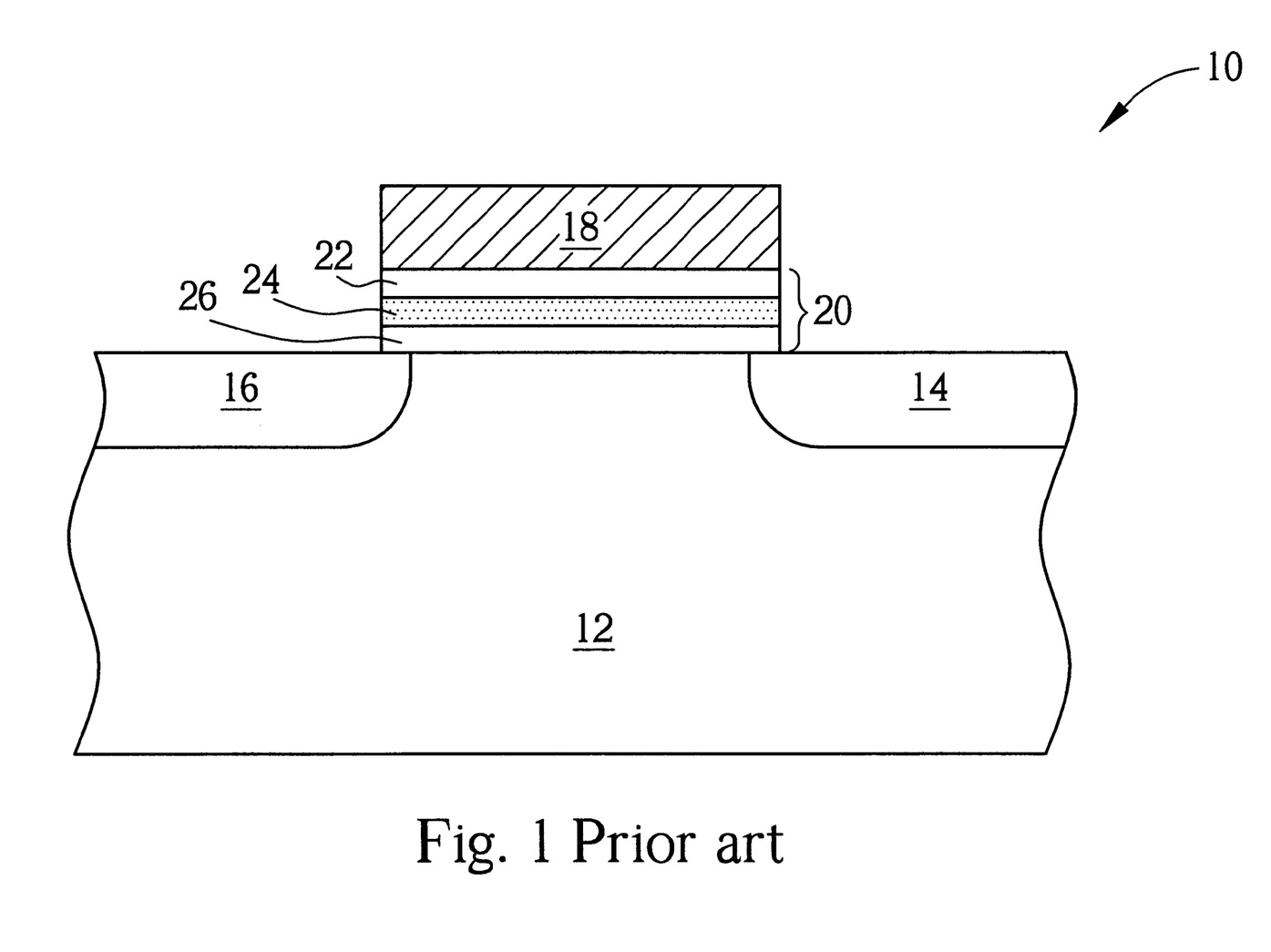
FIG. 1 is a cross-section view illustrating an ONO-type memory cell according to the prior art.
Figure 9:
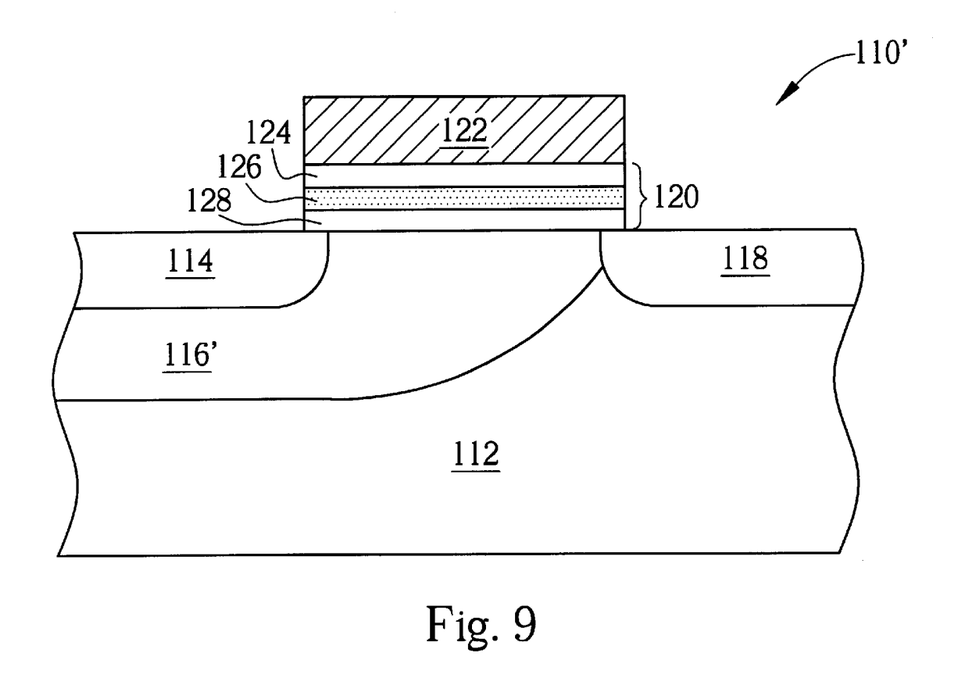
FIG. 9 is a cross-section view illustrating an ONO-type memory cell having a diffusion source and a localized well region overlapped according to the third embodiment of the present invention.

FIG. 1 is a cross-sectional view illustrating a conventional oxide-nitride-oxide (ONO) type flash memory cell 10. As shown in FIG. 9, the memory cell 10 includes a P-type well 12, an N-type source 14 and an N-type drain 16 formed in the P-type well 12, an ONO structure 20 formed on a surface of the P-type well 12 contacting the N-type source 14 and the N-type drain 16, and a control gate 18 formed on the ONO structure 20. The ONO structure 20 comprises, from top to bottom, an insulating layer 22 made of silicon oxide, an isolated charge trapping layer 24 made of silicon nitride, and an insulating layer 26 made of silicon oxide. Since the ONO structure 20 has a large coupling ratio of 1, lower operational voltages are required when programming and erasing the memory cell 10.

Figure 2:
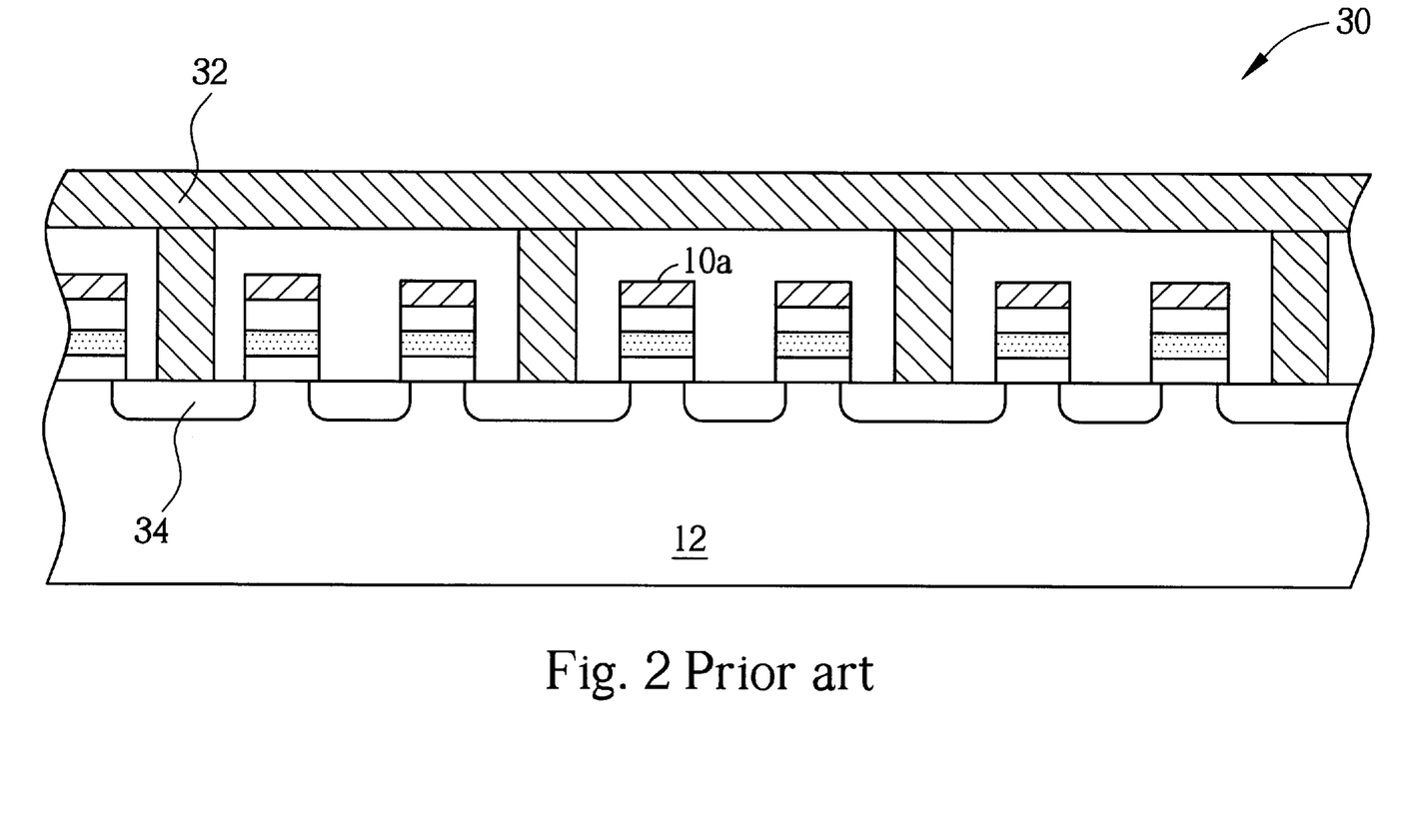
FIG. 2 is a cross-section schematic diagram illustrating an array of ONO-type memory cells according to the prior art.
Figure 2A:
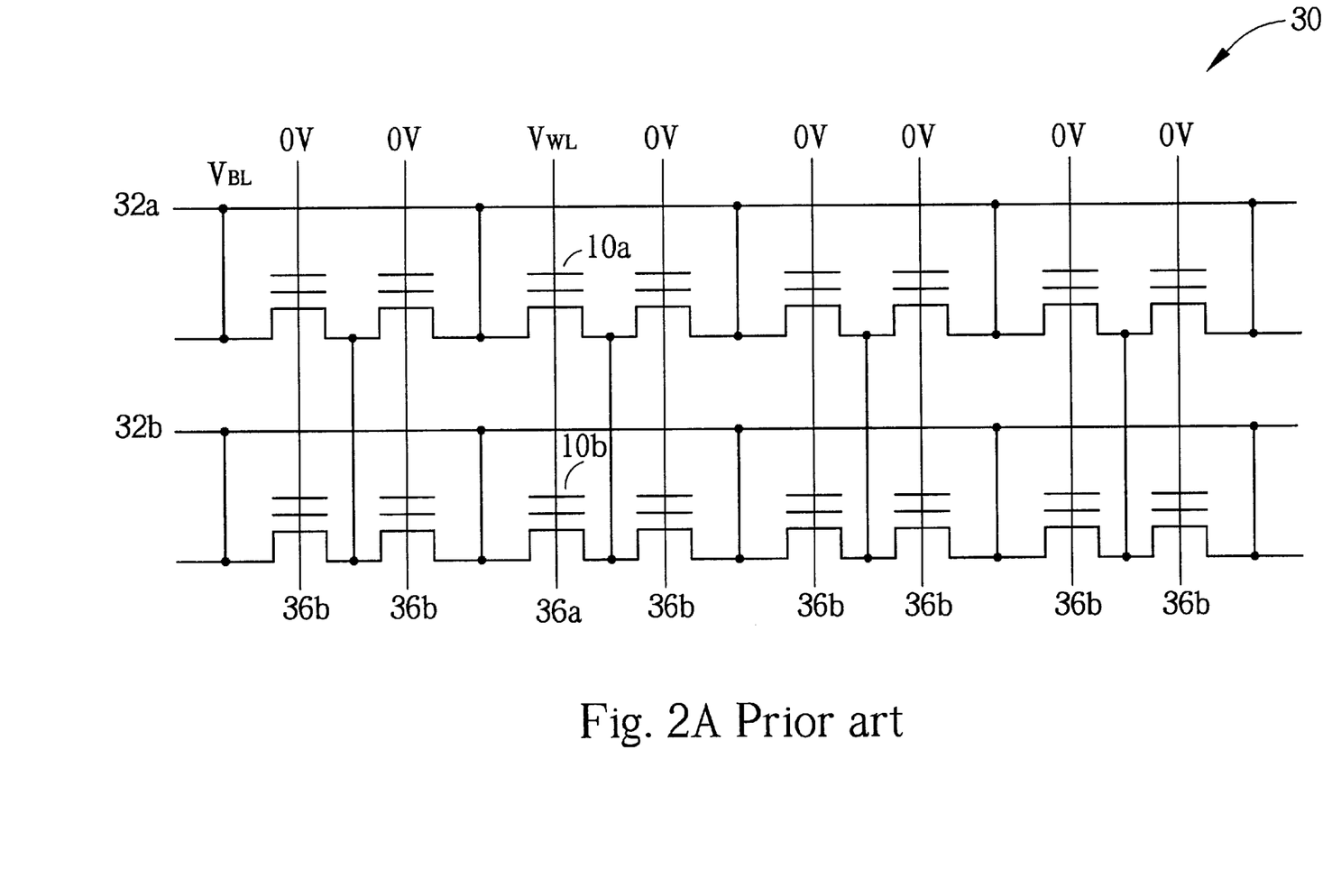
FIG. 2A is an equivalent circuit of the array of the ONO-type memory cells according to the prior art.

However, there is still a disadvantage of the conventional flash memory composed of the ONO-type memory cell 10. FIG. 2 is a cross-sectional schematic diagram illustrating an array 30 of the conventional ONO-type memory cells 10. FIG. 2A is an equivalent circuit of the array 30 of the conventional ONO-type memory cells 10. As shown in FIGS. 2 and 2A, all of the ONO-type memory cells 10 are manufactured on the same P-type well 12, and a bit line 32 is connected to a diffusion region 34 in the P-type well 12.

During a programming operation, for inducing the FN tunneling mechanism, a bit line voltage $V_{BL}$ is applied to the selected bit line 32a, and a word line voltage $V_{WL}$ is applied to a selected word line 36a so as to program a selected memory cell 10a. Since the selected memory cell 10a and unselected memory cells 10b are all formed on the same P-type well 12, the applied voltage will also induce the FN tunneling mechanism in the unselected memory cells 10b under the selected word line 36a. Therefore, the unselected memory cells 10b seriously interfere with the operation of the selected memory cell 10a, resulting in a loss of programming selectivity and a degradation in the performance of the flash memory. Heretofore, none of the prior art discloses a method of selectively programming an individual memory cell of an ONO non-volatile memory array.

SUMMARY OF INVENTION

It is therefore a primary objective of the claimed invention to provide a method of programming and erasing non-volatile memory cells to solve the above-mentioned problems.

According to the claimed invention, a method of selectively programming an individual memory cell of a non-volatile memory array includes the following steps. An array of memory cells is provided. Each of the memory cells comprises a well of a first conductivity type. A diffusion drain of the first conductivity type is encompassed by a localized well region of a second conductivity type in the well. A diffusion source of the first conductivity type is laterally formed adjacent to the localized well region in the well. An isolated charge trapping layer is located between the diffusion drain and diffusion source over the localized well region and the well. A gate is located above the isolated charge trapping layer. A first voltage is applied simultaneously to the diffusion drain and the localized well region of a selected the memory cell through a selected bit line. The diffusion source of the selected memory cell is floated. And a second voltage is applied to the gate of the selected memory cell. Thereby, Fowler-Nordheim (FN) tunneling is induced between the isolated charge trapping layer and the localized well region.

It is an advantage of the present invention method that each memory cell of a non-volatile memory array comprises a diffusion drain encompassed by a localized well region, so that interference with neighboring unselected memory cells under a selected word line is effectively prevented during a programming operation using the FN tunneling mechanism. In addition, since the memory cell of the non-volatile memory utilizes an ONO structure as a floating gate, the operational voltages during programming and erasing is substantially reduced. Consequently, the selectivity and the performance of the non-volatile memory are significantly improved. Furthermore, in addition to the FN tunneling mechanism, a hot hole injection and a channel hot electron mechanisms can also be applied to the programming operation of the non-volatile memory array according to the present invention. Since a diffusion drain and the localized well region can share the voltage required in the diffusion drain of the memory cell, the operational voltage is reduced substantially.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
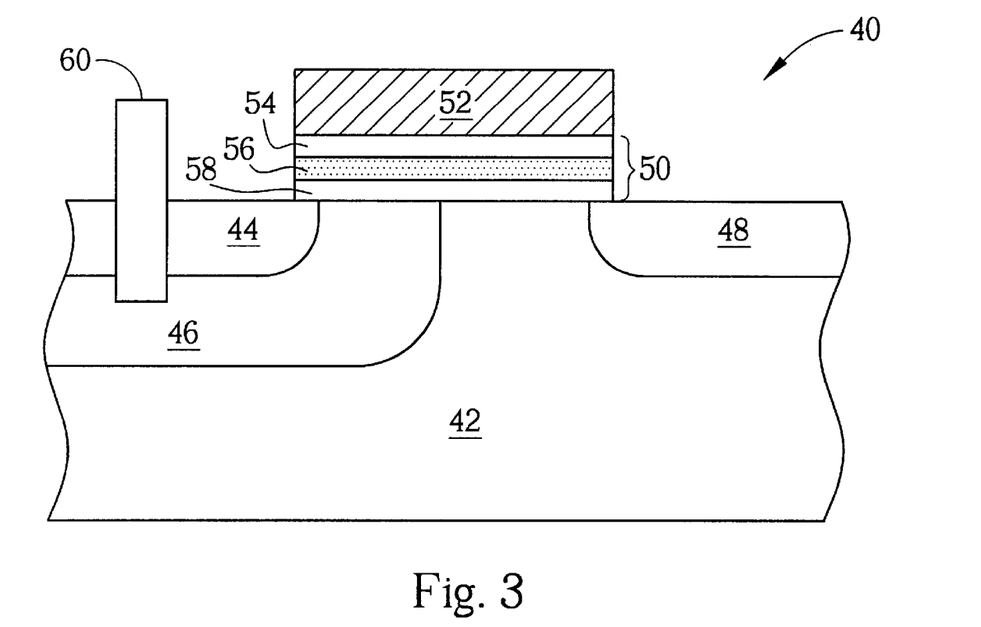
FIG. 3 is a cross-section view illustrating an ONO-type memory cell according to the first embodiment of the present invention.

FIG. 3 is a cross-sectional view illustrating an ONO-type memory cell 40 according to the first embodiment of the present invention. The ONO-type memory cell 40 includes a well 42 of a first conductivity type, a diffusion drain 44 of the first conductivity type encompassed by a localized well region 46 of a second conductivity type in the well 42, a diffusion source 48 of the first conductivity type laterally formed adjacent to the localized well region 46 in the well 42, an ONO structure 50 located between the diffusion drain 44 and the diffusion source 48 over the localized well region 46 and the well 42, and a gate (control gate) 52 above the ONO structure 50. The ONO structure 50 further comprises, from top to bottom, an insulating layer 54 composed of silicon oxide, an isolated charge trapping layer 56 composed of silicon nitride, and another insulating layer 58 composed of silicon oxide. The localized well region 46 is a doped region formed in the well 42 to enclose the diffusion drain 44 so as to isolate the diffusion drain 44 from the well 42.

Figure 4:
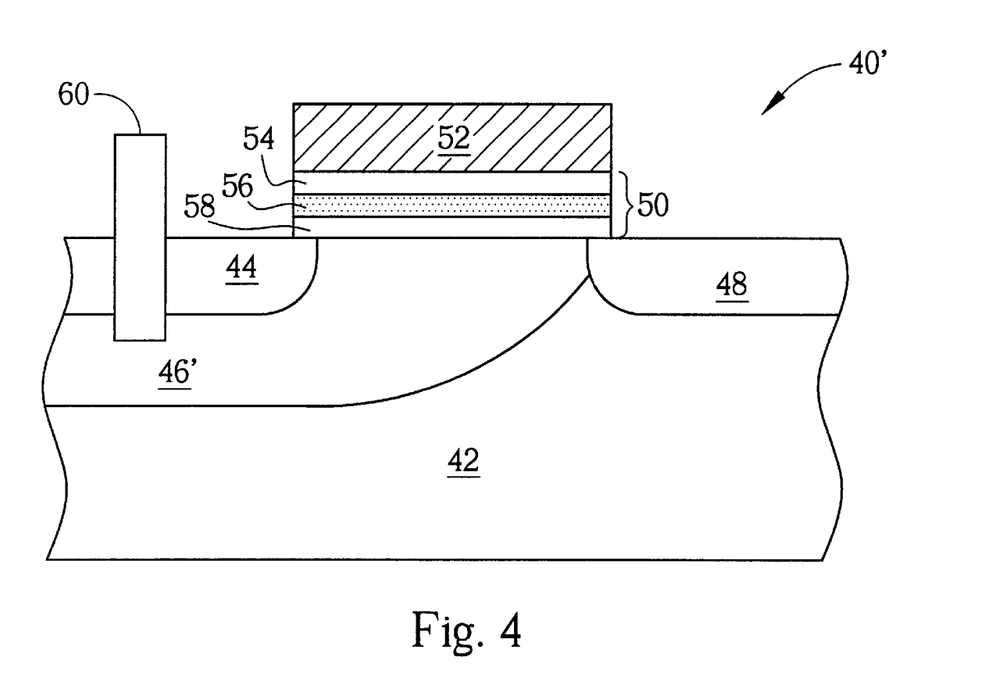
FIG. 4 is a cross-section view illustrating an ONO-type memory cell having a diffusion source and a localized well region overlapped according to the first embodiment of the present invention.

According to the first embodiment of the present invention, the first conductivity type is N-type and the second conductivity type is P-type. Additionally, the localized well region 46 and the diffusion drain 44 may be short-circuited using a metal contact 60 like as shown in FIG. 3. The metal contact 60 penetrates the diffusion drain 44 into the localized well region 46 so as to short-circuit the diffusion drain 44 and the localized well region 46. Furthermore, the diffusion source 48 may either be separated from the localized well region 46 as shown in FIG. 3, or partially overlap with the localized well region 46' in a memory cell 40' as shown in FIG. 4.

Figure 5:
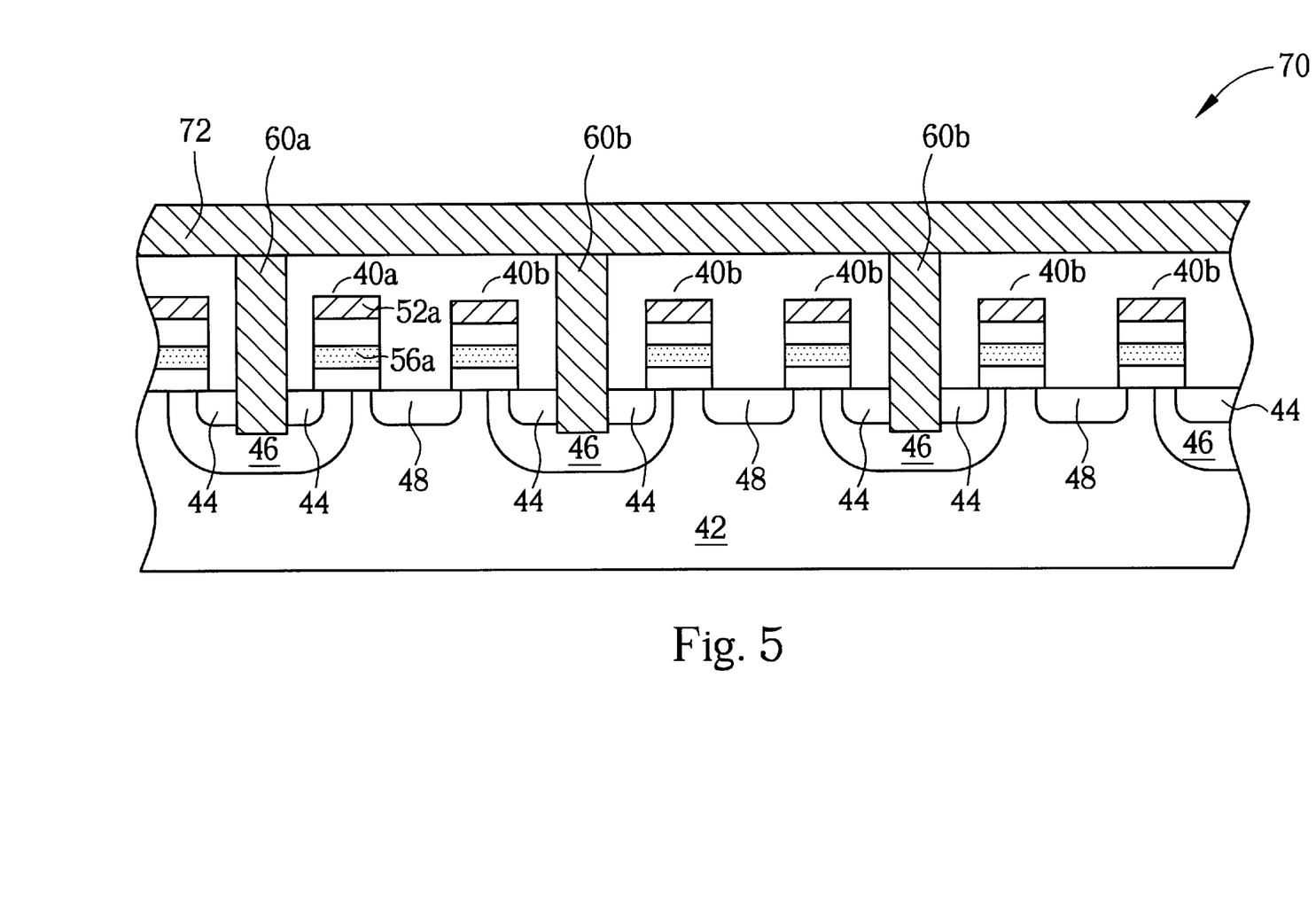
FIG. 5 is a schematic, cross-sectional diagram illustrating an array of ONO-type memory cells according to the first embodiment of the present invention.
Figure 5A:
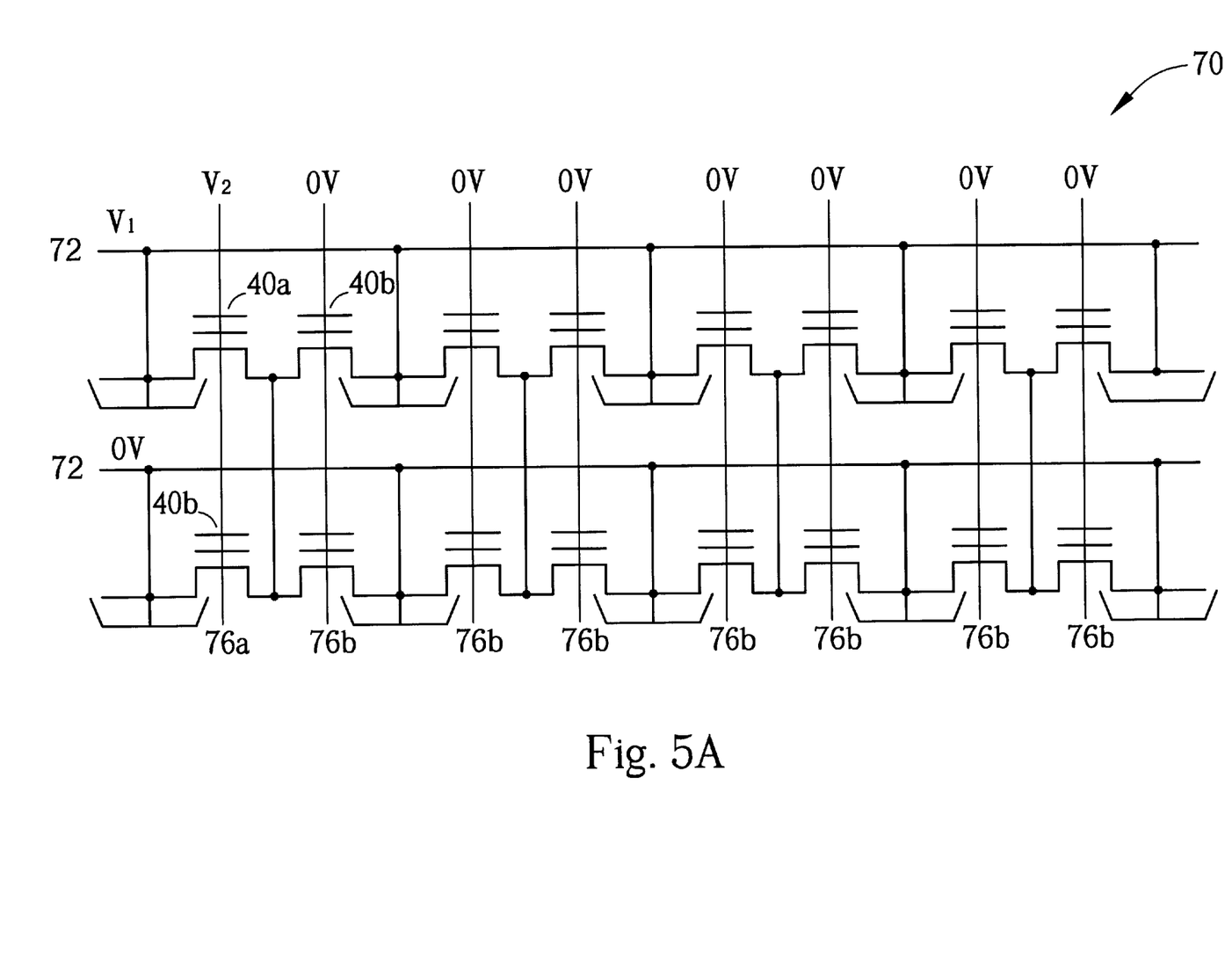
FIG. 5A is an equivalent circuit of the array of the ONO-type memory cells according to the first embodiment of the present invention.

FIG. 5 is a schematic, cross-sectional diagram illustrating an array 70 of ONO-type memory cells 40 according to the first embodiment of the present invention. FIG. 5A is an equivalent circuit of the array 70 of the ONO-type memory cells 40 according to the first embodiment of the present invention. As shown in FIGS. 5 and 5A, the array 70 of the ONO-type memory cells 40 is manufactured on the well 42 of the first conductivity type, and a bit line 72 is connected to the metal contacts 60 which penetrate the diffusion drains 44 into the localized well regions 46 of the ONO-type memory cells 40. Modes of operation of the non-volatile memory can be explained with reference to FIGS. 5, 5A and Table 1.

[t1]

TABLE 1

| [Operational conditions of the selected memory cell] | | | |
|---|---|---|---|
| $V_1$ | $V_2$ | $V_3$ | $V_4$ |
| programming | 3~7 V | −7~−3 V | floating | — |
| erasing | floating | — | −7~−3 V | 3~7 V |

For example, during a programming operation, a first voltage, $V_1$=3~7 Volts, preferably, $V_1$=5 Volts, is applied simultaneously to the diffusion drain 44 and the localized well region 46 of a selected memory cell 40a through a selected metal contact 60a connected to the bit line 72. A second voltage, $V_2$=−7~−3 Volts, preferably, $V_2$=−5 Volts, is applied to a gate 52a of the selected memory cell 40a. The diffusion source 48 of the selected memory cell 40a is floated. With such configuration, a Fowler-Nordheim (FN) tunneling effect is induced between an isolated charge trapping layer 56a and the localized well region 46 so as to charge the charge trapping layer 56a.

Since the diffusion drain 44 of the selected memory cell 40 is formed locally in the well 42 and is encompassed by the localized well region 46, the applied voltage will not induce the FN tunneling mechanism in unselected memory cells 40b under a selected word line 76a. Therefore, the unselected memory cells 40b do not interfere with the programming operation of the selected memory cell, and the non-volatile memory has a more precise programming selectivity. In addition, since the FN tunneling induces the programming operation, the non-volatile memory consumes very little power.

In an erasing operation, a third voltage, $V_3$=−7~−3 Volts, preferably, $V_3$=−5 Volts, is applied to the diffusion source 48 of a selected memory cell 40a. A fourth voltage, $V_4$=3~7 Volts, preferably, $V_4$=5 Volts, is applied to a gate 52a of the selected memory cell 40a. The diffusion drain 44 and the localized well region 46 of the selected memory cell 40a are in a floating state. With such configuration, a FN tunneling effect is induced so as to discharge the charge trapping layer 56a, thereby completing the erasing operation.

Naturally, except for the cell structure of the non-volatile memory described previously according to first embodiment of the present invention, the first conductivity-type doping ions used in the memory cell may also be P-type, and the second conductivity-type would then be N-type. Under this condition, the modes of operation can be described in Table 2.

[t2]

TABLE 2

| [Operational conditions of the selected memory cell] | | | |
|---|---|---|---|
| $V_1$ | $V_2$ | $V_3$ | $V_4$ |
| programming | −7~−3 V | 3~7 V | floating | — |
| erasing | floating | — | 3~7 V | −7~−3 V |

For example, during a programming operation, a first voltage, $V_1$=−7~−3 Volts, preferably, $V_1$=−5 Volts, is applied simultaneously to a diffusion drain 44 and a localized well region 46 of a selected memory cell 40a through a selected metal contact 60a connected to a bit line 72. And a second voltage, $V_2$=3~7 Volts, preferably, $V_2$=5 Volts is applied to a gate 52a of the selected memory cell 40a. A diffusion source 48 of the selected memory cell 40a remains in a floating state. In an erasing operation, a third voltage, $V_3$=3~7 Volts, preferably, $V_3$=5 Volts is applied to a diffusion source 48 of a selected memory cell 40a. A fourth voltage, $V_4$=−7~−3 Volts, preferably, $V_4$=−5 Volts, is applied to a gate 52a of the selected memory cell 40a. And a diffusion drain 44 and a localized well region 46 of the selected memory cell 40a remain in a floating state.

Figure 6:
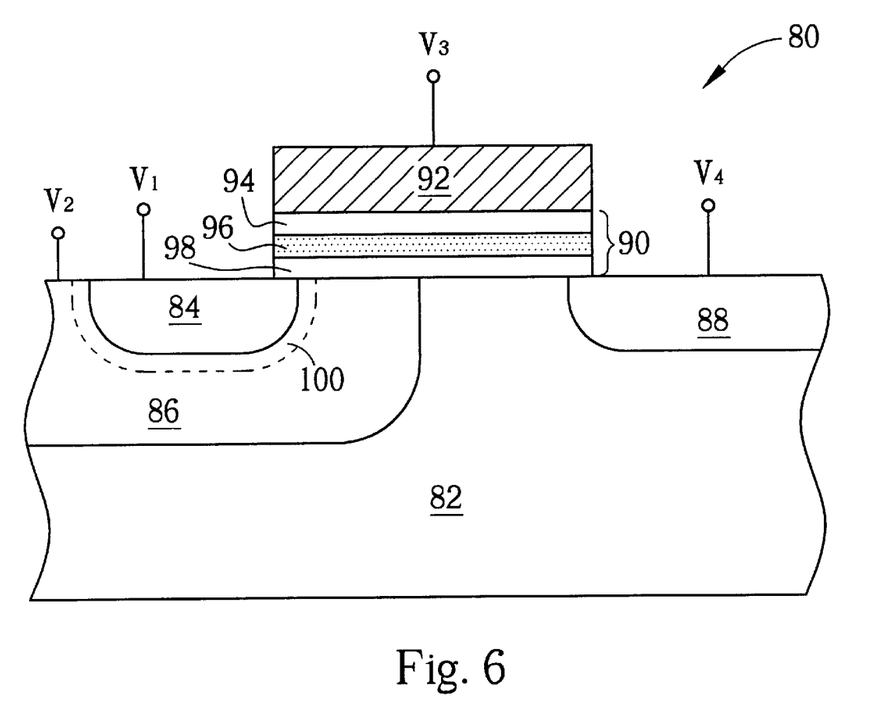
FIG. 6 is a cross-section view illustrating an ONO-type memory cell according to the second embodiment of the present invention.
Figure 7:
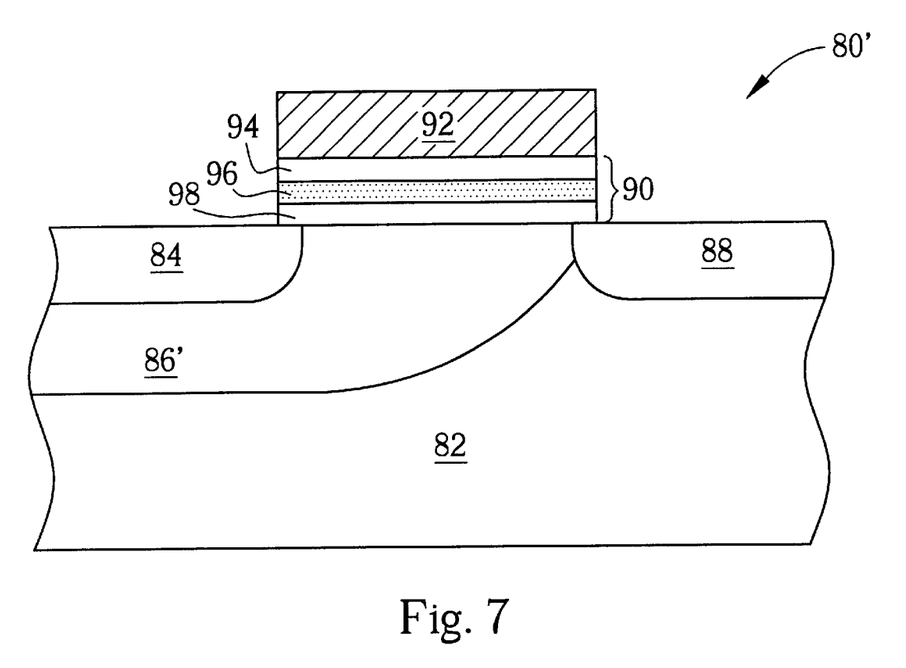
FIG. 7 is a cross-section view illustrating an ONO-type memory cell having a diffusion source and a localized well region overlapped according to the second embodiment of the present invention.

FIG. 6 is a cross-section view illustrating an ONO-type memory cell 80 according to the second embodiment of the present invention. The ONO-type memory cell 80 has a structure identical to that of the ONO-type memory cell 40 except for absence of the metal contact 60. In the second embodiment of the present invention, a well 82, a diffusion drain 84, and a diffusion source 88 are N conductivity-type, and a localized well region 86 is P conductivity-type. Furthermore, the diffusion source 88 may either be separated from the localized well region 86 as shown in FIG. 6, or partially overlap with the localized well region 86' in a memory cell 80' as shown in FIG. 7.

FIG. 6 also shows locations of electric contacts in the non-volatile memory. Using the memory cell 80 as an example of a selected memory cell, a first voltage $V_1$ is applied to the diffusion drain 84 through a selected bit line and a second voltage $V_2$ is applied to the localized well region 86 of the selected memory cell 80. Meanwhile, a third voltage $V_3$ is applied to the gate 92 of the selected memory cell 80 and a fourth voltage $V_4$ is applied to the diffusion source 88 of the selected memory cell 80. The example of the operational voltage is shown in Table 3.

[t3]

TABLE 3

[Operational conditions of the selected memory cell]

|  | $V_1$ | $V_2$ | $V_3$ | $V_4$ |
| --- | --- | --- | --- | --- |
| programming | 1~4 V | −4~−1 V | −5~−1 V | grounded |
| Erasing | floating | −7~−3 V | 1~5 V | grounded |

During a programming operation, the first voltage $V_1$ is positive, $V_1$=1~4 Volts and the second voltage $V_2$ is negative, $V_2$=−4~−Volts, thereby creating a depletion region 100 at a junction of the diffusion drain 84 and the localized well region 86 to generate electron-hole pairs. Preferably, $V_1$2.5 Volts and $V_2$=−2.5 Volts. Meanwhile, the third voltage $V_3$ is negative, $V_3$=−5~−1 Volts and the fourth voltage $V_4$ is grounded, thereby inducing hot hole injection occurring mainly between the isolated charge trapping layer 96 and the depletion region 100 through a Band-to-Band tunneling (BTBT) and completing the programming operation. Preferably, $V_3$=−3.3 Volts.

In an erasing operation, the first voltage $V_1$ is floating and the second voltage $V_2$ is negative, $V_2$=−7~−3 Volts. Preferably, $V_2$=−5 Volts. Meanwhile, the third voltage $V_3$ is positive, $V_3$=1~5 Volts and the fourth voltage $V_4$ is grounded, thereby completing the erasing operation. Preferably, $V_3$=3.3 Volts.

Unlike the memory cell 40, the memory cell 80 has no metal contact to short-circuit the diffusion drain 84 and the localized well region 86, thus the diffusion drain 84 and the localized well region 86 can share the voltage required in the diffusion drain 44 of the memory cell 40 so as to reduce the operational voltage.

Naturally, except for the cell structure of the non-volatile memory described previously according to second embodiment of the present invention, the well 82, the diffusion drain 84, and the diffusion source 88 may also be P conductivity-type, and the localized well region 86 would then be N conductivity-type. In such a case, the magnitudes and signs of the operational voltages would be changed as appropriate depending on the condition.

Figure 8:
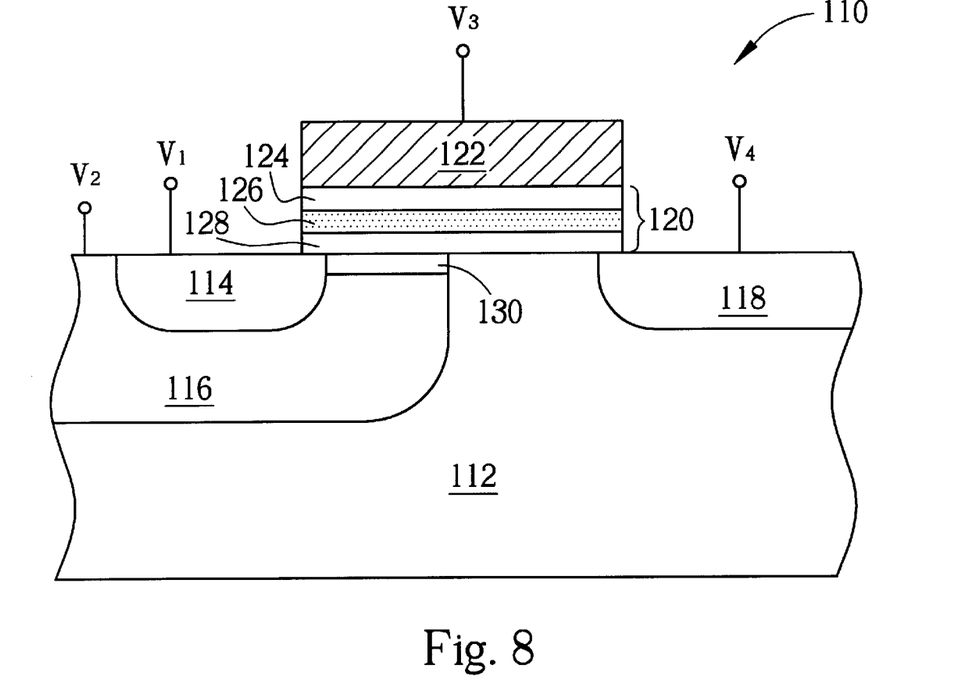
FIG. 8. is a cross-section view illustrating an ONO-type memory cell according to the third embodiment of the present invention.

Additionally, except for the hot hole injection shown in the second embodiment of the present invention, the cell structure 80 may utilize channel hot electrons to achieve the programming operations. FIG. 8 is a cross-section view illustrating an ONO-type memory cell 110 according to the third embodiment of the present invention. The ONO-type memory cell 110 has a structure identical to that of the ONO-type memory cell 80. Likewise, in the third embodiment of the present invention, a well 112, a diffusion drain 114, and a diffusion source 118 are N conductivity type, and a localized well region 116 is P conductivity type. Furthermore, the diffusion source 118 may either be separated from the localized well region 116 as shown in FIG. 8, or partially overlap with the localized well region 116' in a memory cell 110' as shown in FIG. 9.

FIG. 8 also shows the state of electric contacts in the non-volatile memory. Taking the memory cell 110 as an example of a selected memory cell, a first voltage $V_1$ is applied to the diffusion drain 114 through a selected bit line and a second voltage $V_2$ is applied to the localized well region 116 of the selected memory cell 110. Meanwhile, a third voltage $V_3$ is applied to the gate 122 of the selected memory cell 110 and a fourth voltage $V_4$ is applied to the diffusion source 118 of the selected memory cell 110. The example of the operational voltage is shown in Table 4.

[t4]

TABLE 4

[Operational conditions of the selected memory cell]

|  | $V_1$ | $V_2$ | $V_3$ | $V_4$ |
| --- | --- | --- | --- | --- |
| programming | 1~4 V | −4~−1 V | 3~7 V | grounded |
| erasing | 1~4 V | −4~−1 V | −5~−1 V | grounded |

In a programming operation, the first voltag[0085] $V_1$ is positive, $V_1$=1~4 Volts, preferably, $V_1$=2.5 Volts, and the second voltage $V_2$ is negative, $V_2$=−4~−1 Volts, preferably, $V_2$=−2.5 Volts. Meanwhile, the third voltage $V_3$ is positive, for example, $V_3$=3~7 Volts, preferably, $V_3$=5 Volts, and the fourth voltage $V_4$ is grounded. Under such conditions, there is a current flow through a channel 130 sandwiched by the well 112 and the diffusion drain 114 of the memory cell 110. And the so-called channel hot electron is injected into an isolated charge trapping layer 126 by an electric field generated by the voltage applied to the gate 122. Thus, electrons are stored in the gate 122 and the programming operation is completed.

In an erasing operation, the first voltage $V_1$ is positive, $V_1$=1~4 Volts, preferably, $V_1$=2.5 Volts, and the second voltage $V_2$ is negative, $V_2$=−4~−1 Volts, preferably, $V_2$=−2.5 Volts. Meanwhile, the third voltage $V_3$ is negative, $V_3$=−5~−1 Volts, preferably, $V_3$=−3.3 Volts, and the fourth voltage $V_4$ is grounded. At this time, a hot hole is injected into the isolated charge trapping layer 126 by an electric field generated by the voltage applied to the gate 122. Thus, electric holes neutralize electrons stored in the gate 122 and the erasing operation is completed.

Unlike from the memory cell 10 according to the prior art, the memory cell 110 has the diffusion drain 114 and the localized well region 116 share the voltage required in the diffusion drain 16 of the memory cell 10 so as to reduce the operational voltage.

Naturally, except for the cell structure of the non-volatile memory described previously according to third embodiment of the present invention, the well 112, the diffusion drain 114, and the diffusion source 118 may also be P conductivity-type, and the localized well region 116 would then be N conductivity-type. In such a case, the magnitudes and signs of the operational voltages would be changed as appropriate depending on the condition.

In a typical method of programming non-volatile memory cells, for inducing the FN tunneling mechanism, a bit line voltage $V_{BL}$ is applied to a selected bit line, and a word line voltage $V_{WL}$ is applied to a selected word line so as to program a selected memory cell. Since the selected memory cell and unselected memory cells are all formed on the same well, the applied voltage will also induce the FN tunneling mechanism in the unselected memory cells under the selected word line. Therefore, the unselected memory cells seriously interfere with the operation of the selected memory cell, resulting in a loss of programming selectivity and a degradation in the performance of the flash memory.

In contrast to the prior art, the present invention provides a method where each memory cell of a non-volatile memory array comprises a diffusion drain encompassed by a localized well region, so that problems encountered in the prior art such as the interference with neighboring unselected memory cells are effectively prevented during a programming operation. In addition, since the memory cell of the non-volatile memory utilizes an ONO structure as a floating gate, the power needed during programming and erasing is substantially reduced. Consequently, the selectivity and the performance of the non-volatile memory are significantly improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of selectively programming an individual memory cell of a non-volatile memory array, comprising:
    providing an array of memory cells each including a well of a first conductivity type, a diffusion drain of said first conductivity type encompassed by a localized well region of a second conductivity type in said well, a diffusion source of said first conductivity type laterally formed adjacent to said localized well region in said well, an isolated charge trapping layer located between said diffusion drain and diffusion source over said localized well region and said well, and a gate above said isolated charge trapping layer;
    applying a first voltage, simultaneously, to said diffusion drain and said localized well region of a selected said memory cell through a selected bit line;
    floating said diffusion source of said selected memory cell; and
    applying a second voltage to said gate of said selected memory cell thereby inducing Fowler-Nordheim (FN) tunneling at least between said isolated charge trapping layer and said localized well region.

2. The method of claim 1, wherein said first conductivity type is N-type, said second conductivity type is P-type, said first voltage is a positive voltage, and said second voltage is a negative voltage.

3. The method of claim 2, wherein said first voltage is about 3~7 Volts and said second voltage is about −7~−3 Volts.

4. The method of claim 1, wherein said diffusion source partially overlaps said localized well region.

5. The method of claim 1, wherein said diffusion source does not overlap said localized well region.

6. The method of claim 1, wherein said charge trapping layer is composed of silicon nitride.

7. A method of programming flash memory cells, comprising:
    selecting a flash memory cell including a well of a first conductivity type, a diffusion drain encompassed by a localized well region of a second conductivity type in said well, a diffusion source laterally formed adjacent to said localized well region in said well, an isolated charge trapping layer located between said diffusion drain and diffusion source over said localized well region and said well, and a gate above said isolated charge trapping layer;
    applying a first voltage to said diffusion drain through a selected bit line and a second voltage to said localized well region of said selected memory cell thereby creating a depletion region at a junction of said diffusion drain and said localized well region;
    grounding said diffusion source of said selected memory cell; and applying a third voltage to said gate of said selected memory cell thereby inducing hot hole injection occurring at least between said isolated charge trapping layer and said depletion region.

8. The method of claim 7, wherein said diffusion drain and said diffusion source are formed by doping ions having said first conductivity type.

9. The method of claim 7, wherein said first conductivity type is N-type, said second conductivity type is P-type, said first voltage is a positive voltage, said second voltage is a negative voltage, and said third voltage is negative voltage.

10. The method of claim 9, wherein said first voltage is about 1~4 Volts, said second voltage is about −4~−1 Volts and said third voltage is about −1~−5 Volts.

11. The method of claim 7, wherein said diffusion source partially overlaps said localized well region.

12. The method of claim 7, wherein said diffusion source does not overlap said localized well region.

13. The method of claim 7, wherein said charge trapping layer is composed of silicon nitride.

14. A method of programming and erasing flash memory cells, each of the flash memory cells including a well of a first conductivity type, a diffusion drain encompassed by a localized well region of a second conductivity type in said well, a diffusion source laterally formed adjacent to said localized well region in said well, an isolated charge trapping layer located between said diffusion drain and diffusion source over said localized well region and said well, and a gate above said isolated charge trapping layer, the method comprising:
    selecting a flash memory cell and executing a programming process including the steps of:
        applying a first voltage, simultaneously, to said diffusion drain and said localized well region of said selected flash memory cell through a selected bit line;
        floating said diffusion source of said selected flash memory cell; and applying a second voltage to said gate of said selected flash memory cell; and executing an erasing process including the steps of:
        floating said diffusion drain and said localized well region of said selected flash memory cell;
        applying a third voltage to said diffusion source of said selected flash memory cell; and applying a fourth voltage to said gate of said selected flash memory cell.

15. The method of claim 14, wherein said first conductivity type is N-type, said second conductivity type is P-type, said first voltage is a positive voltage, said second voltage is a negative voltage, said third voltage is a negative voltage, and said fourth voltage is a positive voltage.

16. The method of claim 15, wherein said first voltage is about 3~7 Volts, said second voltage is about −7~−3 Volts, said third voltage is about −7~−3 Volts and said fourth voltage is about 3~7 Volts.

17. The method of claim 14, wherein said charge trapping layer is composed of silicon nitride.

18. A method of programming flash memory cells, comprising:

selecting a flash memory cell including an N-well, a diffusion drain encompassed by a localized P-well region in said N-well, a diffusion source laterally formed adjacent to said localized P-well region in said N-well, an isolated charge trapping layer located between said diffusion drain and diffusion source over said localized P-well region and said N-well, and a gate above said isolated charge trapping layer;

applying a first voltage to said diffusion drain through a selected bit line and a second voltage to said localized P-well region of said selected memory cell thereby creating a depletion region at a junction of said diffusion drain and said localized P-well region;

grounding said diffusion source of said selected memory cell; and applying a third voltage to said gate of said selected memory cell.

19. The method of claim 18, wherein said first voltage is about 1~4 Volts, said second voltage is about −4~−1 Volts and said third voltage is about 3~7 Volts.

20. The method of claim 18, wherein said charge trapping layer is composed of silicon nitride.

* * * * *